US011508724B2

(12) United States Patent
Hsu et al.

(10) Patent No.: US 11,508,724 B2
(45) Date of Patent: Nov. 22, 2022

(54) COMPOSITE POWER ELEMENT

(71) Applicant: Cystech Electronics Corp., New Taipei (TW)

(72) Inventors: Hsin-Yu Hsu, New Taipei (TW); Yung-Chang Chen, New Taipei (TW)

(73) Assignee: CYSTECH ELECTRONICS CORP., New Taipei (TW)

(*) Notice: Subject to any disclaimer, the term of this patent is extended or adjusted under 35 U.S.C. 154(b) by 0 days.

(21) Appl. No.: 17/361,412

(22) Filed: Jun. 29, 2021

(65) Prior Publication Data

US 2022/0285341 A1 Sep. 8, 2022

(30) Foreign Application Priority Data

Mar. 5, 2021 (TW) ................................ 110107824

(51) Int. Cl.

*H01L 27/06* (2006.01)
*H01L 29/78* (2006.01)
*H01L 29/66* (2006.01)
*H01L 49/02* (2006.01)

(52) U.S. Cl.

CPC .......... *H01L 27/0629* (2013.01); *H01L 28/20* (2013.01); *H01L 29/66106* (2013.01); *H01L 29/66136* (2013.01); *H01L 29/66734* (2013.01); *H01L 29/7803* (2013.01); *H01L 29/7804* (2013.01); *H01L 29/7808* (2013.01); *H01L 29/7813* (2013.01)

(58) Field of Classification Search

None

See application file for complete search history.

(56) References Cited

U.S. PATENT DOCUMENTS

2008/0067585 A1* 3/2008 Williams ............ H01L 29/7825 257/E29.054
2010/0123185 A1* 5/2010 Hsieh .................... H01L 29/866 257/E27.016
2013/0020576 A1* 1/2013 Hsieh .................. H01L 29/7811 257/66
2013/0069064 A1* 3/2013 Yoshihira ........... H01L 29/7803 257/E27.016

FOREIGN PATENT DOCUMENTS

TW 202105744 A 2/2021

* cited by examiner

*Primary Examiner* — Khaja Ahmad

(74) *Attorney, Agent, or Firm* — Li & Cai Intellectual Property (USA) Office

(57) ABSTRACT

A composite power element includes a substrate structure, an insulation layer, a dielectric layer, a MOSFET, and a Zener diode. The MOSFET is formed in a transistor formation region of the substrate structure. The Zener diode is formed in a circuit element formation region of the substrate structure, and includes a Zener diode doping structure that is formed in the substrate structure and is covered by the insulation layer. The Zener diode doping structure includes a first P-type doped region and a first N-type doped region that is formed on an inner side of the first P-type doped region. The Zener diode further includes a Zener diode metal structure that is formed on the dielectric layer and sequentially passes through the dielectric layer and the insulation layer to be electrically connected to the first P-type doped region and the first N-type doped region.

10 Claims, 15 Drawing Sheets

100 B B3 B1 B2 A R $V_Z$ $V_D$ 23 33 332 332 331 33L MOSFET,3 31 32 33 34 2 23 21 22 1 13 12 11 101 7 23 21 S G HV MOSFET D 22 13 31L 12 11 102 62 61 62 6,R 42 41 42 4,$V_Z$ 52 51 52 5,$V_D$ D 32N 32P 32N 31 34 34L 32

COMPOSITE POWER ELEMENT

CROSS-REFERENCE TO RELATED PATENT APPLICATION

This application claims the benefit of priority to Taiwan Patent Application No. 110107824, filed on Mar. 5, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power element, and more particularly to a composite power element.

BACKGROUND OF THE DISCLOSURE

In conventional power elements, such as metal-oxide-semiconductor field-effect transistor (MOSFET), if additional circuit elements (i.e., Zener diode) are needed in a circuit design to form an electronic circuit with specific functions, these circuit elements need to be electrically connected to a power element by soldering. However, this type of connection between the circuit elements and the power element will increase the complexity of product manufacturing and cannot effectively reduce a volume of an end product.

SUMMARY OF THE DISCLOSURE

In response to the above-referenced technical inadequacies, the present disclosure provides a composite power element.

In one aspect, the present disclosure provides a composite power element including a substrate structure, an insulation layer, a dielectric layer, a metal-oxide-semiconductor field-effect transistor, and a Zener diode. The substrate structure includes a base layer and an epitaxial layer formed on the base layer. At least one trench is concavely formed on the epitaxial layer, the substrate structure defines a transistor formation region and a circuit element formation region adjacent to the transistor formation region along a length direction of the substrate structure, and the trench is located in the transistor formation region. The insulation layer is extendedly formed on the epitaxial layer and an inner wall of the trench, a portion of the insulation layer located on the inner wall of the trench is defined as a trench insulation layer, the trench insulation layer surrounds a groove, and a portion of the insulation layer located on the surface of the epitaxial layer is defined as a cover insulation layer. The dielectric layer is formed on the cover insulation layer. The metal-oxide-semiconductor field-effect transistor is located in the transistor formation region and includes: a gate filling structure, a matrix doping structure, a source metal structure, and a drain metal structure. The gate filling structure is formed in the groove of the trench insulation layer. The matrix doping structure is formed in the epitaxial layer and located in a surrounding area of the trench, and the matrix doping structure is covered by the cover insulation layer. The source metal structure is formed on the dielectric layer and sequentially passes through the dielectric layer and the cover insulation layer to be in contact with the matrix doping structure. The drain metal structure is formed on a bottom surface of the base layer. The Zener diode is located in the circuit element formation region and includes: a Zener diode doping structure and a Zener diode metal structure. The Zener diode doping structure is formed in the epitaxial layer and is covered by the cover insulation layer. The Zener diode doping structure includes a first P-type doped region and a first N-type doped region. The Zener diode metal structure is formed on the dielectric layer and sequentially passes through the dielectric layer and the cover insulation layer to be in contact with the first P-type doped region and the first N-type doped region of the Zener diode doping structure, so that the Zener diode is capable of receiving a reverse bias voltage when the composite power element is energized.

Therefore, the composite power element of the present disclosure can integrate formations of different electronic components (i.e., Zener diode, normal diode, and resistor) into the structure of the metal-oxide-semiconductor field-effect transistor so as to form a required power element, without the need for additional processes, thereby simplifying the complex process.

In addition, the composite power element of the present disclosure is a silicon-based architecture in the design of the Zener diode and the normal diode. Accordingly, the composite power element of the present disclosure can obtain a relatively stable output voltage, and can be applied to a lower and wider input voltage range.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1A:
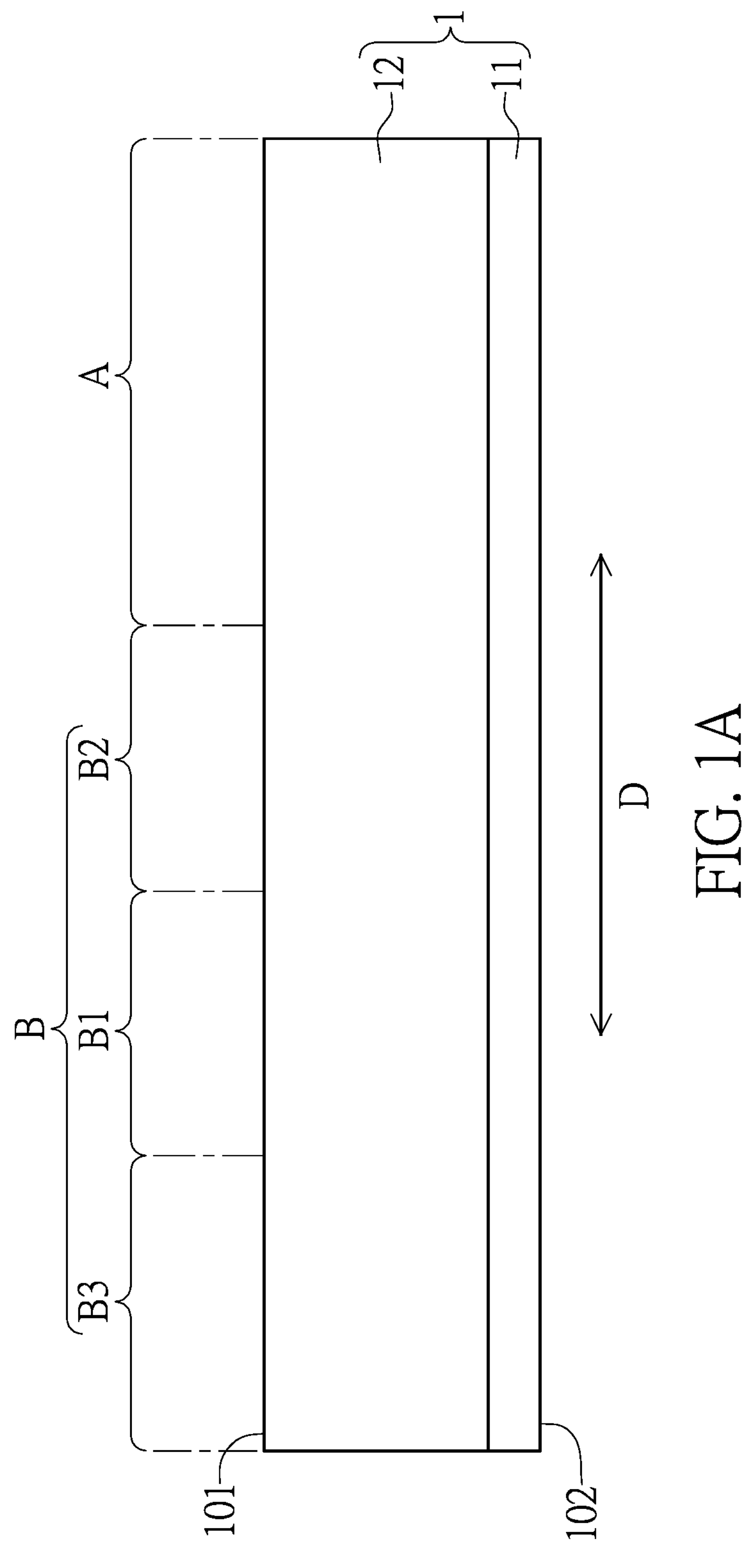
FIG. 1A to FIG. 1I are schematic views showing a method for manufacturing a composite power element according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1B:
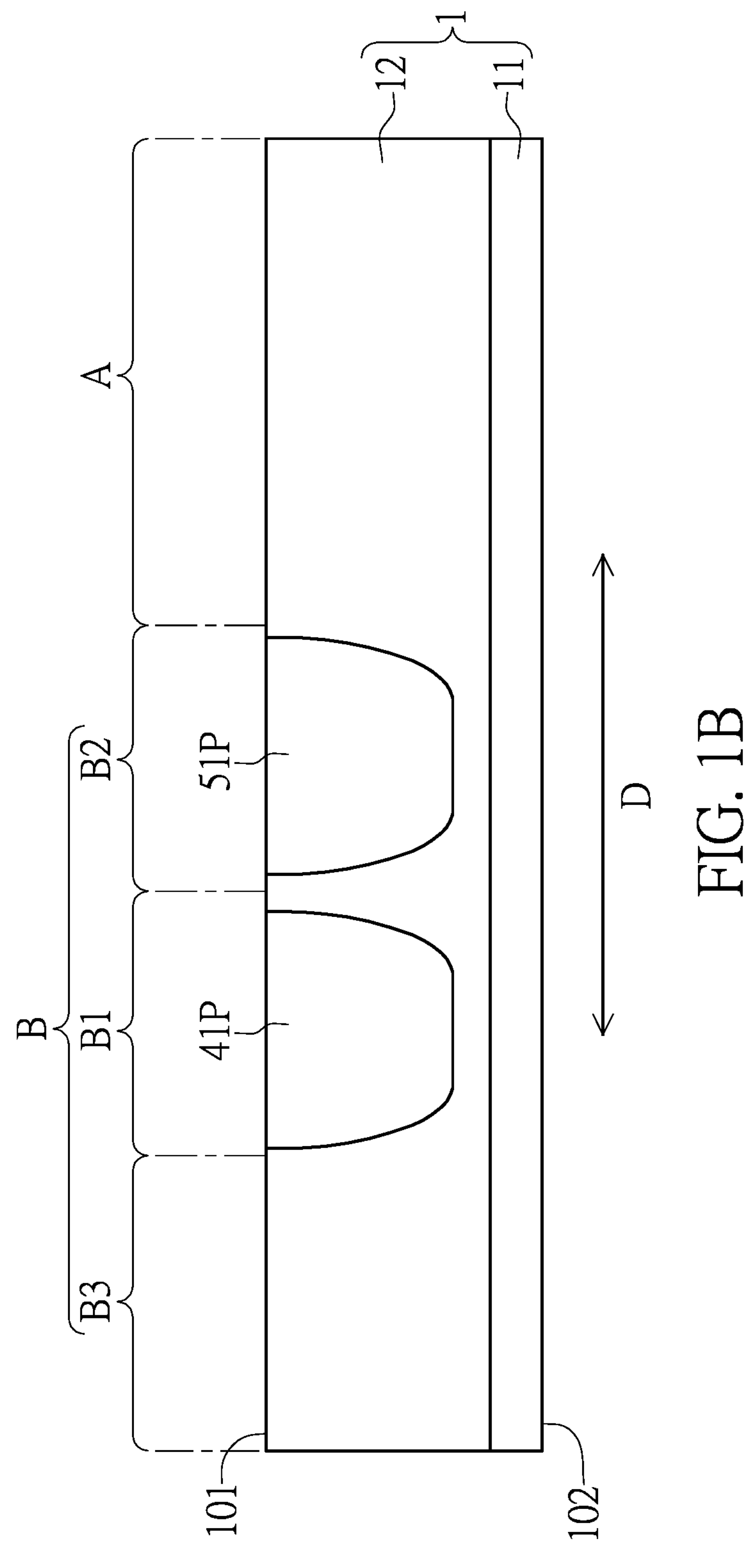
Figure 1C:
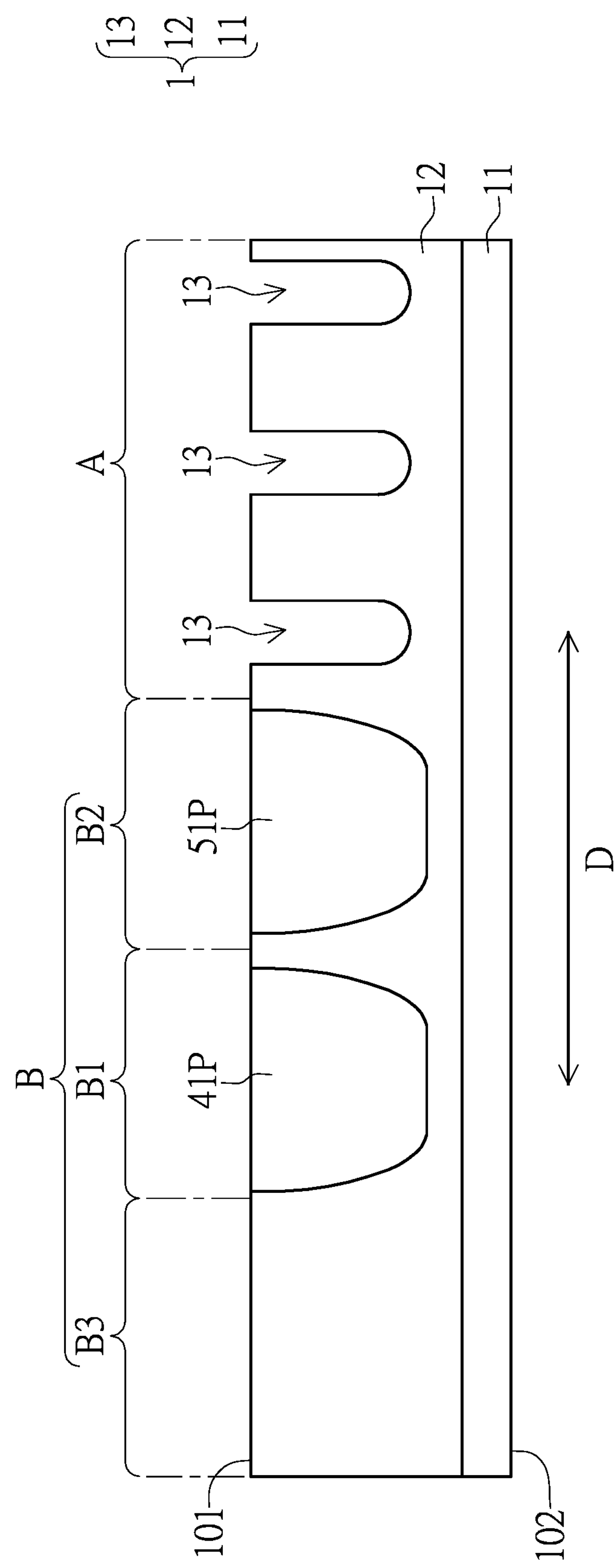
Figure 1D:
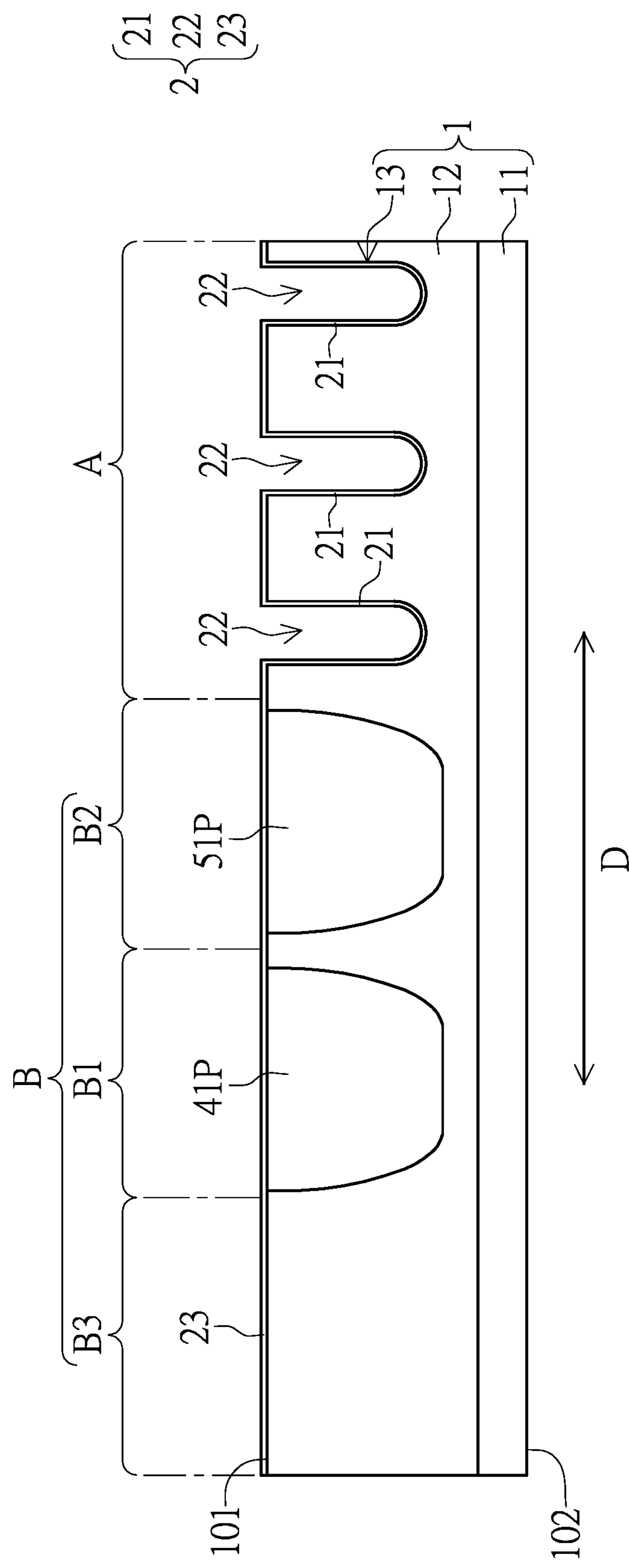
Figure 1E:
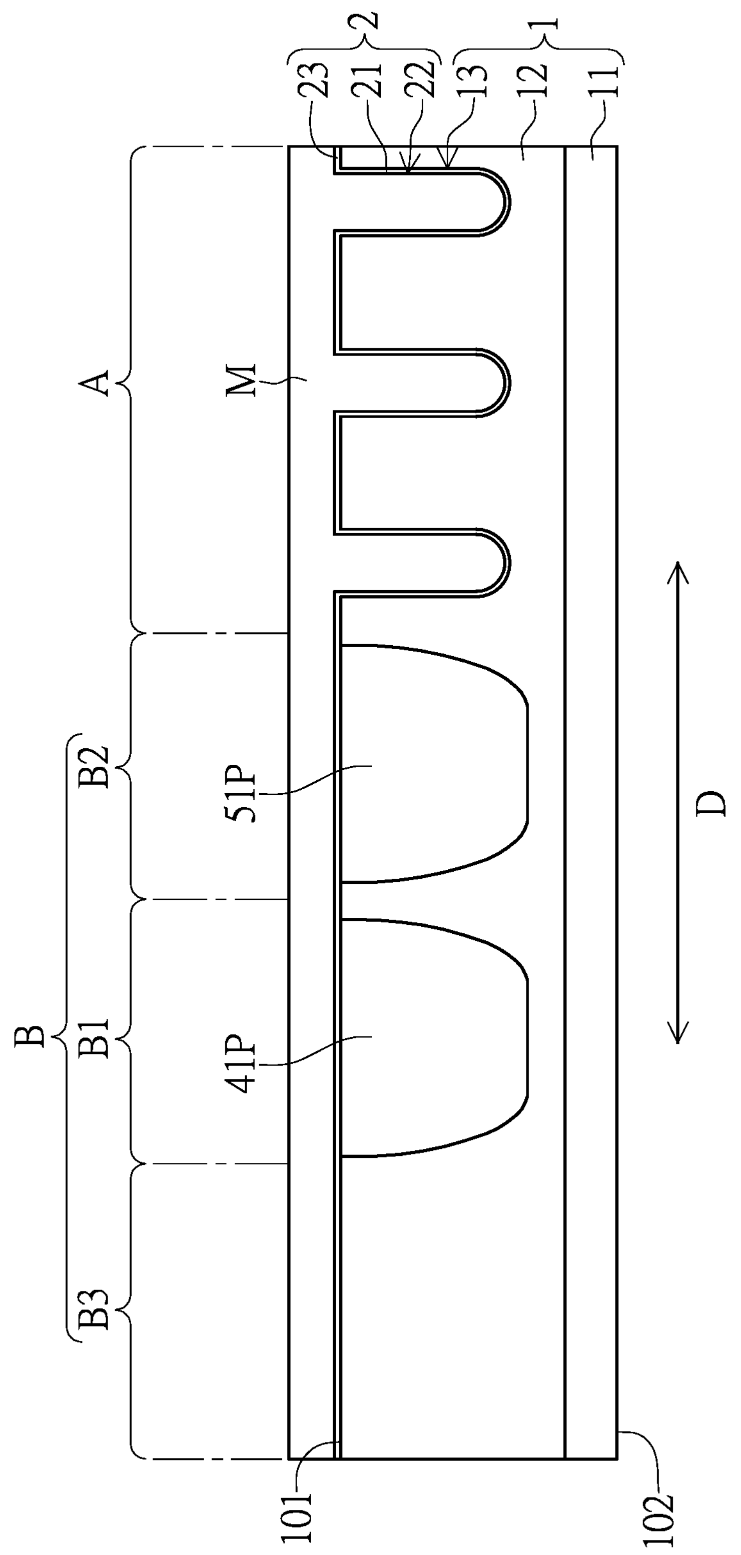
Figure 1F:
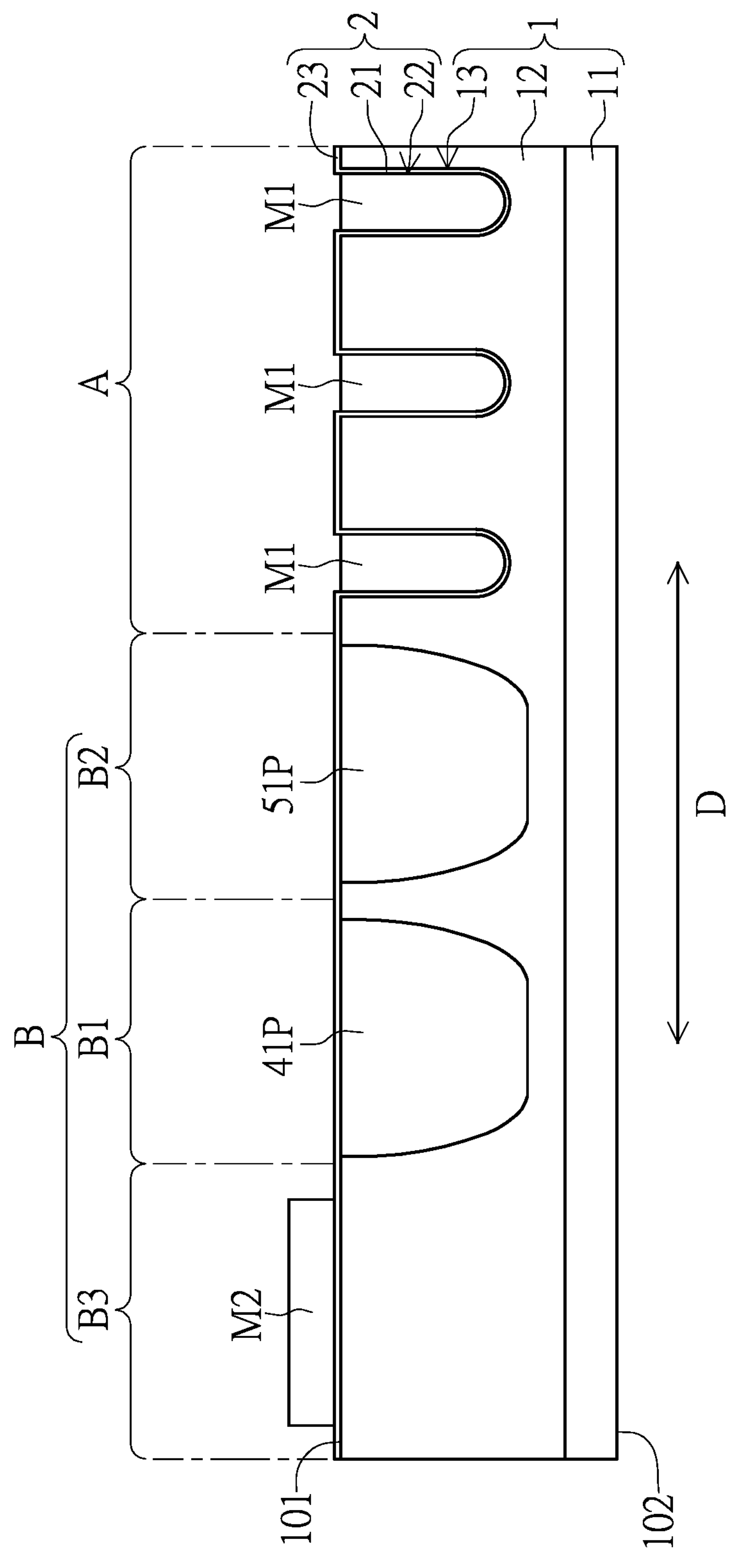
Figure 1G:
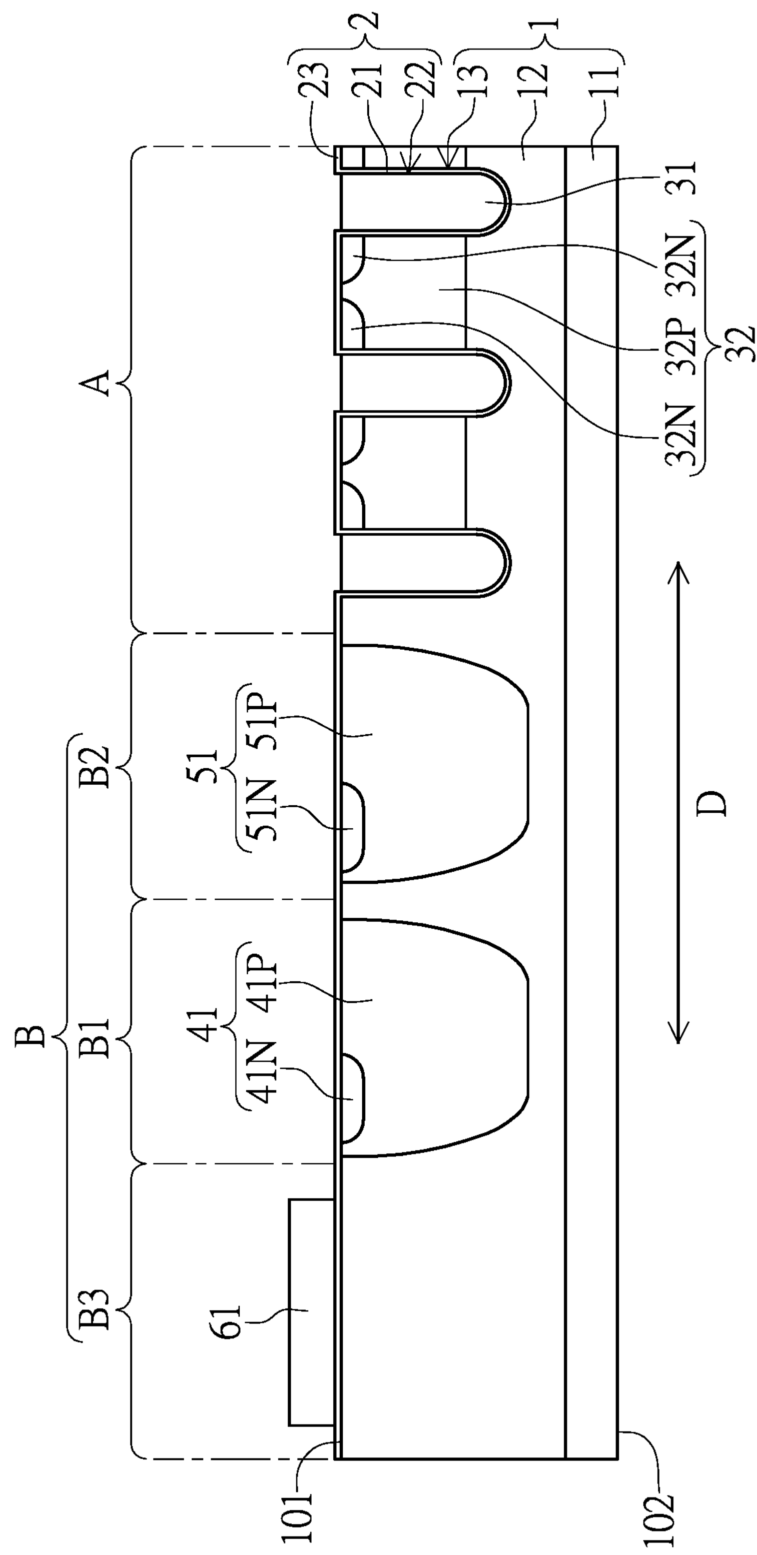
Figure 1H:
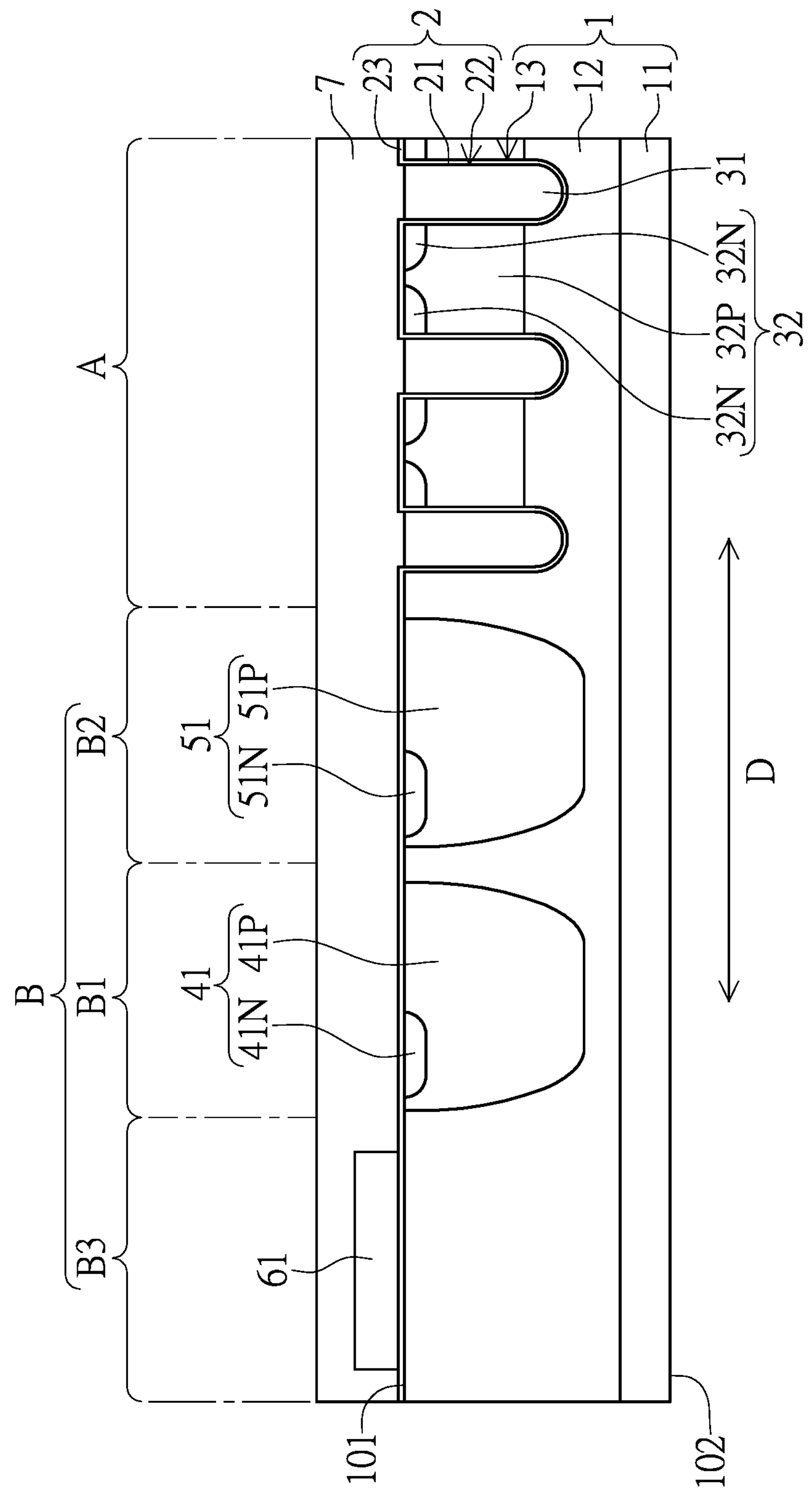
Figure 1I:
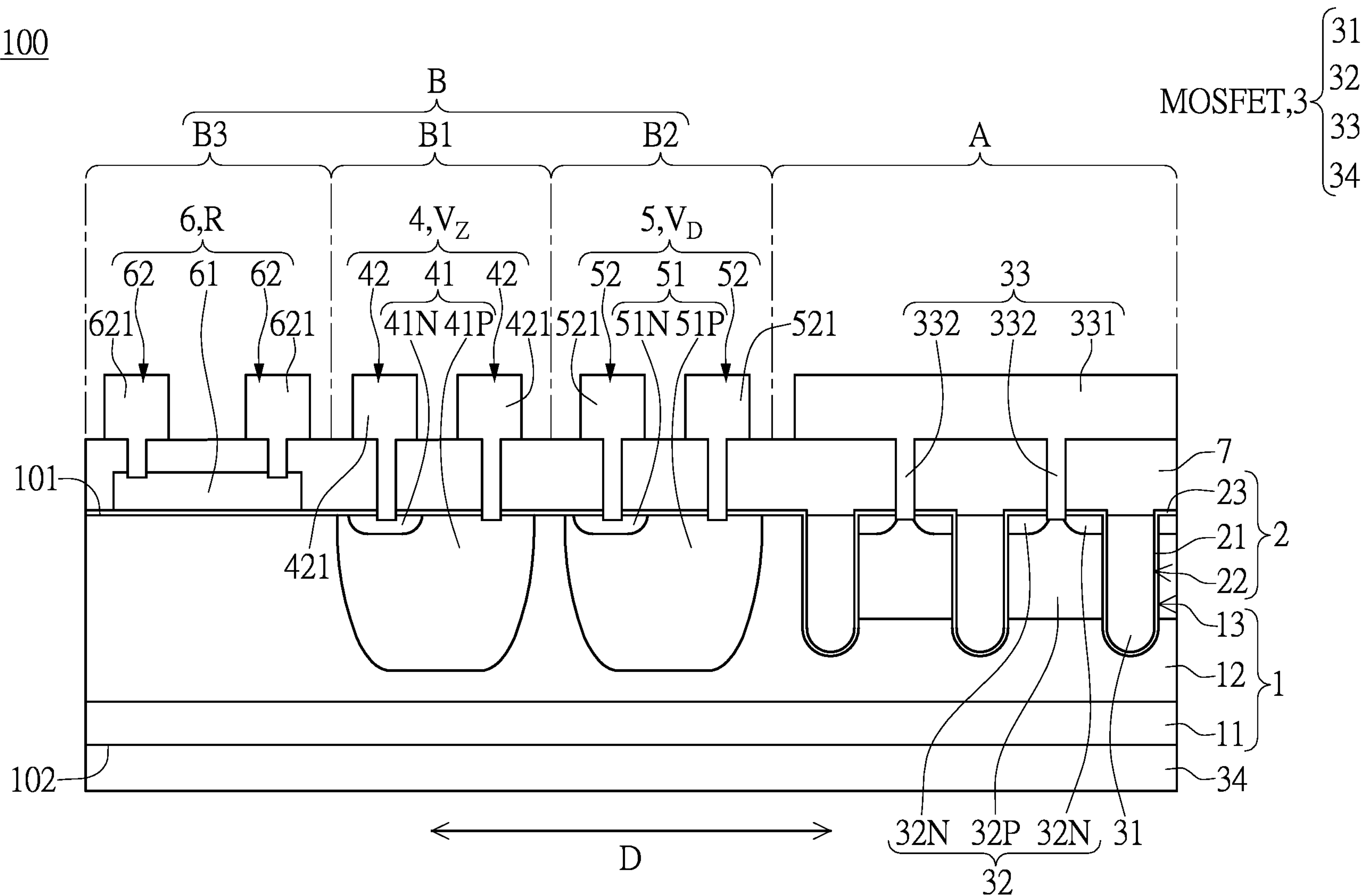
Figure 2:
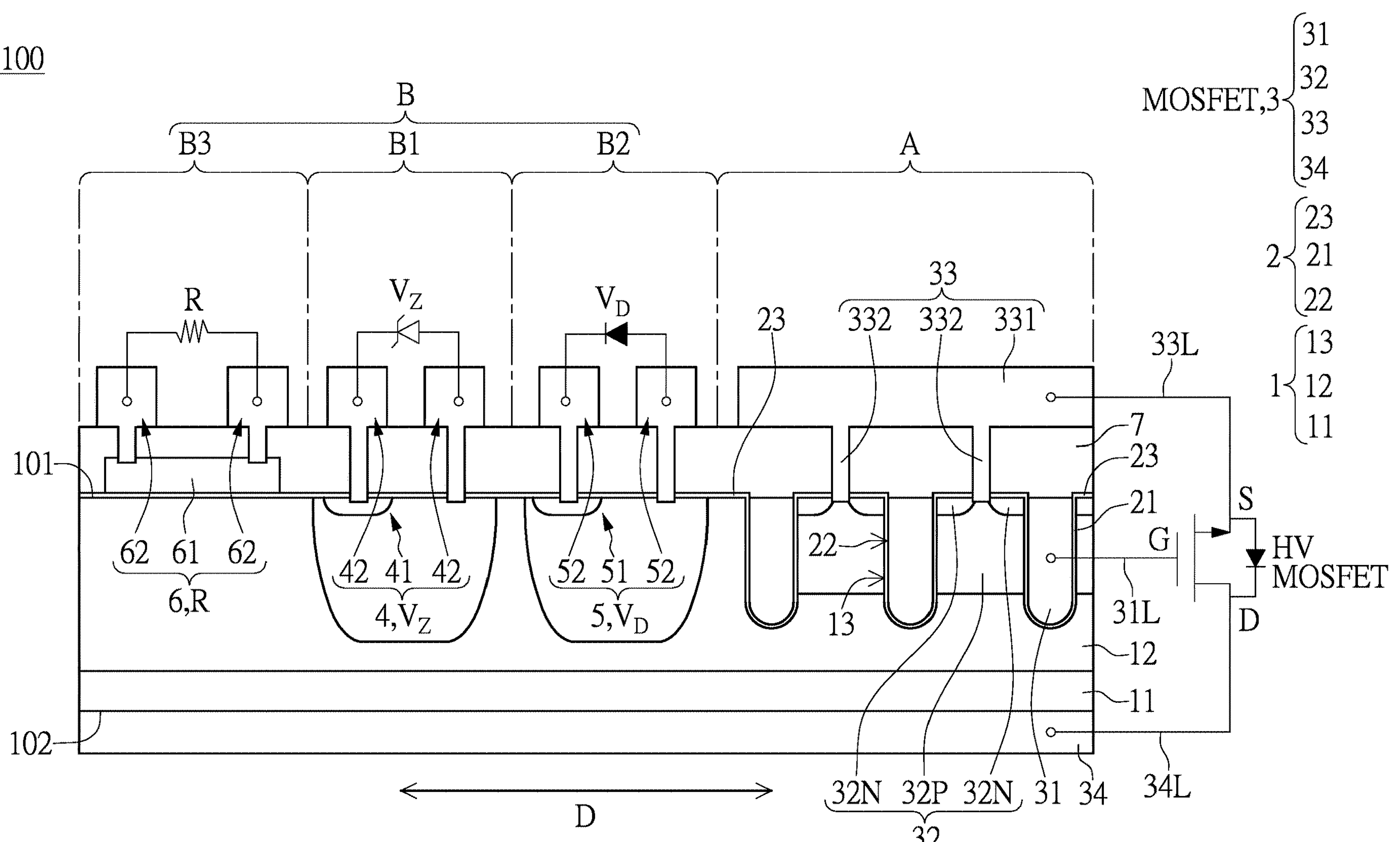
FIG. 2 is a cross-sectional view showing the composite power element according to the first embodiment of the present disclosure (indicating an equivalent circuit corresponding to the components in the power element)
Figure 3:
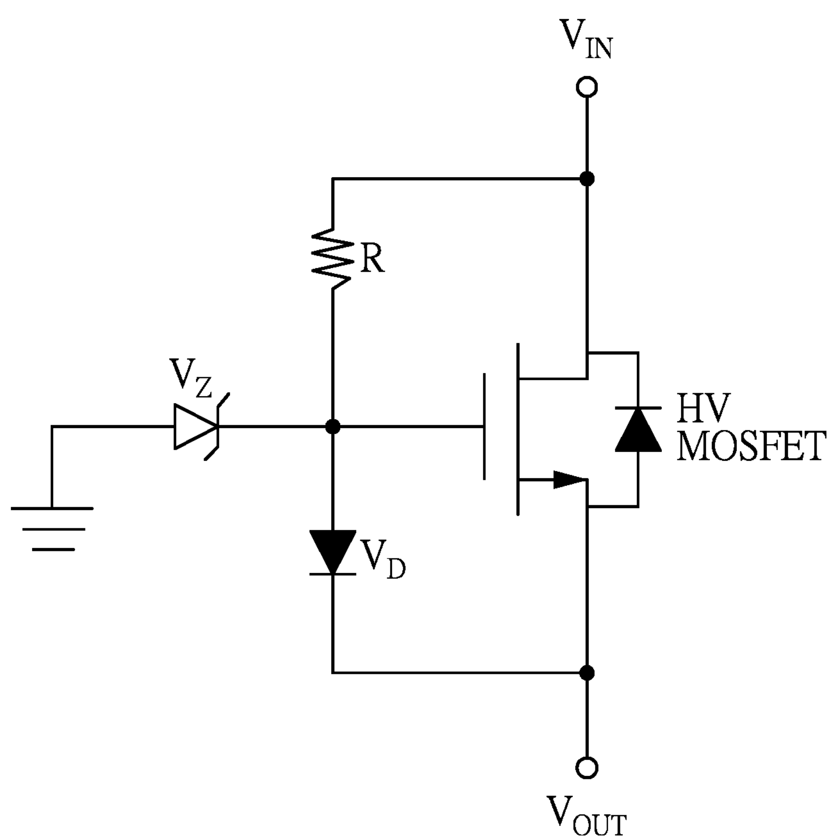
FIG. 3 is an equivalent circuit diagram of the composite power element according to the first embodiment of the present disclosure.

Referring to FIG. 1A to FIG. 1I, FIG. 2, and FIG. 3, a first embodiment of the present disclosure provides a method for manufacturing a composite power element 100. The method for manufacturing the composite power element includes steps S101 to S109. FIG. 1A to FIG. 1I are schematic views showing the method for manufacturing the composite power element according to the first embodiment of the present disclosure. FIG. 2 is a cross-sectional view showing the composite power element according to the first embodiment of the present disclosure (indicating an equivalent circuit corresponding to the components in the power element). FIG. 3 is an equivalent circuit diagram of the composite power element according to the first embodiment of the present disclosure.

It should be noted that the order of the steps and the actual operation in the present embodiment can be adjusted according to requirements and are not limited to those in the present embodiment.

The composite power element 100 of the present embodiment is a power element based on a metal-oxide-semiconductor field-effect transistor (MOSFET). That is, the composite power element 100 of the present embodiment is an improved power element of the metal-oxide-semiconductor field-effect transistor as a basic structure. Furthermore, the composite power element 100 of the present embodiment can be applied to a high voltage regulator, but the present disclosure is not limited thereto.

In the present embodiment, the method for manufacturing the composite power element is firstly described below. For ease of understanding, a unit region of the composite power element is taken as an example, and a cross-sectional view of the unit region is used for explanation. The diagram corresponding to each step can be referred to, as can the diagrams of other steps, if necessary. The specific steps of the method for manufacturing the composite power element are described below.

Referring to FIG. 1A, step S101 includes: providing a substrate structure 1. The substrate structure 1 includes a base layer 11 and an epitaxial layer 12 formed on the base layer 11, in which two opposite surfaces of the substrate structure 1 are respectively defined as a top surface 101 and a bottom surface 102. More specifically, a side surface of the epitaxial layer 12 away from the base layer 11 is defined as the top surface 101, and a side surface of the base layer 11 away from the epitaxial layer 12 is defined as the bottom surface 102.

Further, a material of the base layer 11 may be, for example, an $N^+$ type doped semiconductor or a $P^+$ type doped semiconductor. The epitaxial layer 12 may be formed on the base layer 11 through an epitaxial process, and a material of the epitaxial layer 12 may be, for example, an $N^-$ type doped semiconductor or a $P^-$ type doped semiconductor, in which a conductive type of the epitaxial layer 12 may be the same as a conductive type of the base layer 11.

In the present embodiment, the base layer 11 is an $N^+$ type doped semiconductor (also called $N^+$ substrate), and the epitaxial layer 12 is an $N^-$ type doped semiconductor (also called $N^-$ EPI). In addition, a doping concentration of the base layer 11 is greater than that of the epitaxial layer 12. That is, the base layer 11 is a heavily doped region, and the epitaxial layer 12 is a lightly doped region, but the present disclosure is not limited thereto.

Further, the substrate structure 1 defines a transistor formation region A and a circuit element formation region B adjacent to the transistor formation region A along a length direction D of the substrate structure 1. The circuit element formation region B can be further divided into a Zener diode formation region B1, a normal diode formation region B2, and a resistor formation region B3.

It should be noted that in the present embodiment, the Zener diode formation region B1 is located between the normal diode formation region B2 and the resistor formation region B3, but the present disclosure is not limited thereto. That is, the present disclosure has no limitation on a layout design and layout sequence of the Zener diode formation region B1, the normal diode formation region B2, and the resistor formation region B3.

Referring to FIG. 1B, step S102 includes: performing a first ion implantation operation, so that the epitaxial layer 12 of the substrate structure 1 forms a first P-type doped region 41P and a second P-type doped region 51P. The first P-type doped region 41P and the second P-type doped region 51P are spaced apart from each other, and are both located in the circuit element formation region B. More specifically, the first P-type doped region 41P is located in the Zener diode formation region B1, and the second P-type doped region 51P is located in the normal diode formation region B2.

Furthermore, the first P-type doped region 41P and the second P-type doped region 51P are both formed through the first ion implantation operation from the top surface 101 toward the bottom surface 102 of the epitaxial layer 12. The top surface of the first P-type doped region 41P is flush with the top surface 101 of the epitaxial layer 12. The top surface of the second P-type doped region 51P is also flush with the top surface 101 of the epitaxial layer 12.

In addition, the first P-type doped region 41P and the second P-type doped region 51P are fully formed in the epitaxial layer 12. A bottom portion of the first P-type doped region 41P and a bottom portion of the second P-type doped region 51P are not in contact with the base layer 11 and are spaced apart from the base layer 11 by a distance. In the present embodiment, the first P-type doped region 41P is a P-type doped region, and the second P-type doped region 51P is also a P-type doped region, but the present disclosure is not limited thereto.

Referring to FIG. 1C, step S103 includes: performing a trench formation operation to form a plurality of trenches 13 that are recessed in the epitaxial layer 12, and the plurality of trenches 13 are all located in the above-mentioned transistor formation region A. The plurality of trenches 13 may be, for example, formed by etching.

More specifically, the plurality of trenches 13 are recessed from the side surface of the epitaxial layer 12 away from the base layer 11 at intervals along the length direction D. Further, bottom portions of the plurality of trenches 13 are not in contact with the base layer 11 and are spaced apart from the base layer 11 by a distance. In other words, the plurality of trenches 13 are recessed from the top surface of the substrate structure 1 and are not in contact with the base layer 11 of the substrate structure 1.

It should be noted that the plurality of trenches 13 mentioned above are described with respect to the trenches 13 at different locations in the epitaxial layer 12 from a cross-sectional view angle. When viewing the power element as a whole, the trenches 13 may be in spatial communication with each other or be separated from each other, and the present disclosure is not limited thereto.

Furthermore, although the present embodiment is described by taking the first ion implantation operation (step S102) and then the trench formation operation (step S103) as an example for description, the present disclosure is not limited thereto. For example, the trench formation operation may also be performed before the first ion implantation operation.

Referring to FIG. 1D, step S104 includes: performing an insulation layer formation operation to extendedly form an insulation layer 2 (also called oxide layer) on the top surface 101 of the epitaxial layer 12, the top surface of the first P-type doped region 41P, the top surface of the second P-type doped region, and the inner walls of the plurality of trenches 13.

In other words, the insulation layer formation operation enables the top surface 101 of the epitaxial layer 12, the top surface of the first P-type doped region 41P, the top surface of the second P-type doped region 51P, and the inner walls of the plurality of trenches 13, to be covered by the insulating layer 2.

The insulation layer 2 may be formed by a low temperature oxide deposition (LTO deposition) process or a thermal oxidation process. In addition, the material of the insulation layer 2 may be, for example, silicon compound. For example, the material of the insulation layer 2 may be silicon dioxide, but the present disclosure is not limited thereto.

Furthermore, the portion of the insulation layer 2 located on the inner wall of each of the trenches 13 is defined as a trench insulation layer 21 (or trench oxide layer). Each of the trench insulation layers 21 surroundingly forms a groove 22. That is, the plurality of trench insulation layers 21 are respectively formed on the inner walls of the plurality of trenches 13, and the plurality of trench insulation layers 21 respectively surround to form the plurality of grooves 22. In addition, the remaining portion of the insulation layer 2 (i.e., the portion of the insulation layer 2 located on the top surface 101 of the epitaxial layer 12, the top surface of the first P-type doped region 41P, and the top surface of the second P-type doped region) is defined as a cover insulation layer 23 (also called cover oxide layer).

The plurality of trench insulation layers 21 are all located in the above-mentioned transistor formation region A. The cover insulation layer 23 is extendingly located in the above-mentioned transistor formation region A and the circuit element formation region B.

Referring to FIG. 1E, step S105 includes: performing a poly-silicon material deposition operation to form a poly-silicon material M on the side surface of the insulation layer 2 away from the epitaxial layer 12, so that the poly-silicon material M covers the cover insulation layer 23 and is filled in a plurality of grooves 22 respectively surrounded by the plurality of trench insulation layers 21. The poly-silicon material M may be formed by silane ($SiH_4$) through a low pressure chemical vapor deposition (LPCVD) process, but the present disclosure is not limited thereto.

In the present embodiment, the poly-silicon material M is deposited to a certain thickness on the insulation layer 2, so that an outer surface of the poly-silicon material M (i.e., the side surface of the poly-silicon material M away from the epitaxial layer 12) is a flat surface. More specifically, the portions of the outer surface of the poly-silicon material M located above the plurality of grooves 22 and the cover insulation layer 23 are substantially flush with each other, but the present disclosure is not limited thereto.

Referring to FIG. IF, step S106 includes: performing a lithography imaging process and an etching process on the poly-silicon material M to remove a portion of the poly-silicon material M. Accordingly, a plurality of poly-silicon filling structures M1 are respectively formed in the plurality of grooves 22 surrounded by the plurality of trench insulation layers 21. The plurality of polysilicon filling structures M1 and the plurality of trench insulation layers 21 are all located in the above-mentioned transistor formation region A. In addition, a poly-silicon bulk structure M2 is formed on the cover insulation layer 23.

Further, after the plurality of poly-silicon filling structures M1 are etched, exposed outer surfaces of the plurality of poly-silicon filling structures M1 (i.e., top surfaces of the polysilicon filling structures M1 in FIG. 1F) are lower than the outer surface of the cover insulation layer 23 (i.e., the top surface of the cover insulation layer 23 in FIG. 1F), but the present disclosure is not limited thereto.

In addition, the poly-silicon bulk structure M2 is formed on the side surface of the cover insulation layer 23 away from the epitaxial layer 12, and the poly-silicon bulk structure M2 is located in the above-mentioned resistor formation region B3, so as to be fabricated into a specific circuit element (e.g., resistor) in a subsequent manufacturing process.

In other words, the poly-silicon bulk structure M2 is different from the first P-type doped region 41P and the second P-type doped region 51P. The poly-silicon bulk structure M2 is formed on the top surface of the cover insulation layer 23. The first P-type doped region 41P and the second P-type doped region 51P are formed in the epitaxial layer 12 and covered by the cover insulation layer 23.

From another perspective, the poly-silicon bulk structure M2 is located on a side of the cover insulation layer 23. The first P-type doped region 41P and the second P-type doped region 51P are both located on another side of the cover insulation layer 23. Furthermore, the poly-silicon bulk structure M2, the first P-type doped region 41P, and the second P-type doped region 51P are located at different positions along the length direction D.

It is worth mentioning that, in the present embodiment, raw material M of the poly-silicon filling structure M1 and raw material M of the poly-silicon bulk structure M2 are formed in the same polysilicon deposition process, but the present disclosure is not limited thereto. For example, the raw material M of the poly-silicon filling structure M1 and the raw material M of the poly-silicon bulk structure M2 can also be formed through different polysilicon deposition processes according to process requirements.

Referring to FIG. 1G, step S107 includes: performing a second ion implantation operation, so that each of the poly-silicon filling structures M1 is formed as a gate filling structure 31 (also called doped polysilicon filling structure), a portion of the epitaxial layer 12 located between any two adjacent trenches 13 is formed as a matrix doping structure 32, an inner side of the first P-type doped region 41P forms a first N-type doped region 41N, an inner side of the second P-type doped region 51P forms a second N-type doped region 51N, and the poly-silicon bulk structure M2 is formed as a resistor doping structure 61.

It is worth mentioning that, in the present embodiment, in order to perform different doping procedures (e.g., P-type doping or N-type doping) on the poly-silicon filling structure Ml, the poly-silicon bulk structure M2, and the epitaxial layer 12, the ion implantation process may include, for example, multiple ion implantation procedures which includes P-type doped ion implantation procedures and N-type doped ion implantation procedures, but the present disclosure is not limited thereto.

Further, each of the gate filling structures 31 may be, for example, one of a P-type doped semiconductor and an N-type doped semiconductor, but the present disclosure is not limited thereto.

Furthermore, each of a plurality of matrix doping structures 32 includes a matrix P-type doped region 32P and two matrix N-type doped regions 32N formed on the matrix P-type doped region 32P. Specifically, in each of the matrix doping structures 32, the two matrix N-type doped regions 32N and the matrix P-type doped region 32P are stacked on top of each other. The matrix P-type doped region 32P is located on a lower portion of the matrix doping structure 32 and abuts against the epitaxial layer 12. The two matrix N-type doped regions 32N are located on an upper portion of the matrix doping structure 32. More specifically, the two matrix N-type doped regions 32N are located on two sides of a top portion of the matrix P-type doped region 32P, and formed spaced apart from each other. Furthermore, the two matrix N-type doped regions 32N are covered by the cover insulation layer 23.

It is worth mentioning that the conductive type of the matrix P-type doped region 32P is different from the conductive type of the base layer 11 ($N^+$ type doped semiconductor), and is also different from the conductive type of the epitaxial layer 12 ($N^-$ type doped semiconductor). Specifically, the plurality of matrix P-type doped regions 32P of the present embodiment are $P^-$ type doped semiconductors, and the implanted ion type may be, for example, boron ions ($B^+$), but the present disclosure is not limited thereto.

More specifically, the first P-type doped region 41P and the first N-type doped region 41N collectively constitute a Zener diode doping structure 41. The first P-type doped region 41P and the first N-type doped region 41N are formed from the top surface 101 toward the bottom surface 102 of the epitaxial layer 12.

Furthermore, in the epitaxial layer 12, a doping depth of the first P-type doped region 41P is greater than a doping depth of the first N-type doped region 41N, a doping range of the first P-type doped region 41P is greater than a doping range of the first N-type doped region 41N, and the doping range of the first P-type doped region 41P covers the doping range of the first N-type doped region 41N.

From another perspective, the first N-type doped region 41N is formed on an inner side of the first P-type doped region 41P. The top surface of the first N-type doped region 41N and the top surface of the first P-type doped region 41P are coplanar, and are flush with the top surface 101 of the epitaxial layer 12. The top surface 101 of the epitaxial layer 12, the top surface of the first N-type doped region 41N, and the top surface of the first P-type doped region 41P are all covered by the cover insulation layer 23. Furthermore, the first N-type doped region 41N is surrounded by the first P-type doped region 41P except for the top surface of the first N-type doped region 41N.

Furthermore, similar to the Zener diode doping structure 41, the second P-type doped region 51P, and the second N-type doped region 51N collectively constitute a normal diode doping structure 51. The second P-type doped region 51P and the second N-type doped region 51N are formed from the top surface 101 toward the bottom surface 102 of the epitaxial layer 12.

Furthermore, in the epitaxial layer 12, a doping depth of the second P-type doped region 51P is greater than a doping depth of the second N-type doped region 51N, a doping range of the second P-type doped region 51P is greater than a doping range of the second N-type doped region 51N, and the doping range of the second P-type doped region 51P covers the doping range of the second N-type doped region 51N.

From another perspective, the second N-type doped region 51N is formed on an inner side of a top portion of the second P-type doped region 51P. The top surface of the second N-type doped region 51N and the top surface of the second P-type doped region 51P are coplanar, and are flush with the top surface 101 of the epitaxial layer 12. The top surface 101 of the epitaxial layer 12, the top surface of the second N-type doped region 51N, and the top surface of the second P-type doped region 51P are all covered by the cover insulation layer 23. Furthermore, the second N-type doped region 51N is surrounded by the second P-type doped region 51P except for the top surface of the second N-type doped region 51N.

Furthermore, the resistor doping structure 61 may be, for example, one of a P-type doped semiconductor and an N-type doped semiconductor. In the present embodiment, the resistor doping structure 51 is preferably the P-type doped semiconductor, but the present disclosure is not limited thereto. Furthermore, a doping concentration of the resistor doping structure 61 is less than a doping concentration of the Zener diode doping structure 41 or a doping concentration of the normal diode doping structure 51, so as to generate a resistance effect.

It is worth mentioning that, in the present embodiment, the two matrix N-type doped regions 32N of each of the matrix doping structures 32, the first N-type doped region 41N of the Zener diode doping structure 41, and the second N-type doped region 51N of the normal diode doping structure 51 are all completed in the same ion implantation process and have substantially the same doping depths, but the present disclosure is not limited thereto.

It should be noted that the ions used in the ion implantation process described herein may be, for example, boron ions ($B^+$), zinc ions ($Zn^{2+}$), fluoride ions ($F^-$), nitrogen ions ($N^-$), oxygen ion ($O^{2-}$), carbon ion ($C^{4+}$), argon ion ($Ar^+$), phosphorus ion ($P^+$), arsenic ion ($As^+$), or antimony ion ($Sb^{2+}$).

Referring to FIG. 1H, step S108 includes: performing a dielectric layer formation operation to form a dielectric layer 7 (also called inter layer dielectric, ILD) on the substrate structure 1, so that the cover insulation layer 23, the gate filling structures 31, and the resistor doping structure 61 are covered by the dielectric layer 7.

The dielectric layer 7 may be formed by a chemical vapor deposition process, but the present disclosure is not limited thereto. For example, the dielectric layer 7 may also be formed by a physical vapor deposition process or other suitable deposition processes. Furthermore, a material of the dielectric layer 7 may be, for example, a silicon compound or other dielectric materials.

Further, an outer surface of the dielectric layer 7 may be planarized by a chemical mechanical polishing (CMP) process, but the present disclosure is not limited thereto.

Referring to FIG. 1I, step S109 includes: performing a metallization process to respectively form a source metal structure 33, a Zener diode metal structure 42, a normal diode metal structure 52, and a resistor metal structure 62 on the dielectric layer 7, and to form a drain metal structure 34 on the bottom surface 102 of the substrate structure 1.

It should be noted that the "metal structure" mentioned herein may be formed by deposition, and the "metal structure" may be an integrated structure formed of an aluminum/silicon/copper alloy, but the actual application of the present disclosure is not limited thereto.

Furthermore, the source metal structure 33 is located in the transistor formation region A. The source metal structure 33 is formed on a side surface of the dielectric layer 7 away from the base layer 11, and the source metal structure 33 sequentially passes through the dielectric layer 7 and the cover insulation layer 23 to be electrically connected to at least one of the plurality of matrix doping structures 32.

In the present embodiment, the source metal structure 33 includes a source metal conductive portion 331 and two source metal contact plugs 332 connected to the source metal conductive portion 331.

The source metal conductive portion 331 is formed on the side surface of the dielectric layer 7 away from the base layer 11. The two source metal contact plugs 332 are spaced apart from each other and sequentially pass through the dielectric layer 7 and the cover insulation layer 23, so that the source metal conductive portion 331 can be electrically connected to two adjacent matrix doping structures 32 among the plurality of matrix doping structures 32 through the two source metal contact plugs 332.

Furthermore, a width of each of the source metal contact plugs 332 is smaller than a width of the corresponding matrix doping structure 32 connected thereto. Each of the source metal contact plugs 332 extends into a region between the two corresponding matrix N-type doped regions 32N, so as to be in contact with the two corresponding matrix N-type doped regions 32N and the matrix P-type doped region 32P. Accordingly, the two source metal contact plugs 332 are equipotential compared to the two matrix doping structures 32 they are electrically connected to.

It is worth mentioning that, in the present embodiment, an extension depth of each of the source metal contact plugs 332 extending between the two matrix N-type doped regions 32N is preferably less than a doping depth of each of the two matrix N-type doped regions 32N. That is, the extension depth of each of the source metal contact plugs 332 extending between the two matrix N-type doped regions 32N preferably does not exceed the two matrix N-type doped regions 32N, but the present disclosure is not limited thereto.

The drain metal structure 34 is formed on the bottom surface 102 of the substrate structure 1. That is, the drain metal structure 34 is formed on the side surface of the base layer 11 away from the epitaxial layer 12. In the present embodiment, the drain metal structure 34 fully covers the bottom surface 102 of the substrate structure 1, but the present disclosure is not limited thereto.

According to the above configuration, as shown in FIG. 2, the source metal structure 33 can be used to electrically connect a source wire 33L to define a source S of the metal-oxide-semiconductor field-effect transistor (MOSFET). The drain metal structure 34 can be used to electrically connect a drain wire 34L to define a drain D of the metal-oxide-semiconductor field-effect transistor. In addition, one of the plurality of gate filling structures 31 (i.e., the rightmost gate filling structure in FIG. 2) can be used to electrically connect a gate wire 31L to define a gate G of the metal-oxide-semiconductor field-effect transistor. The above-mentioned various components (i.e., the source metal structure 33, the drain metal structure 34, the gate filling structure 31, etc.) located in the transistor formation region A can jointly form a metal-oxide-semiconductor field-effect transistor 3, and the equivalent circuit diagram is shown in FIG. 3.

Referring to FIG. 1I and FIG. 2, the Zener diode metal structure 42, the normal diode metal structure 52, and the resistor metal structure 62 are all located in the circuit element formation region B.

The Zener diode metal structure 42 is located in the Zener diode formation region B1. The Zener diode metal structure 42 is formed on the side surface of the dielectric layer 7 away from the base layer 11, and sequentially passes through the dielectric layer 7 and the cover insulation layer 23 to be in contact with and electrically connected to the Zener diode doping structure 41 that is covered by the cover insulation layer 23. The Zener diode metal structure 42 and the Zener diode doping structure 41 can be matched with each other to form a Zener diode 4, Vz. The Zener diode 4 is configured to receive a reverse bias voltage, and the Zener diode 4 can withstand a voltage of between 5 volts and 6 volts.

In the present embodiment, the Zener diode metal structure 42 includes two metal pins 421. The two metal pins 421 of the Zener diode metal structure 42 are spaced apart from each other, and both sequentially pass through the dielectric layer 7 and the cover insulation layer 23 to be respectively and electrically connected to the first N-type doped region 41N and the first P-type doped region 41P of the Zener diode doping structure 41, so that the Zener diode 4 is formed.

More specifically, one of the metal pins 421 of the Zener diode metal structure 42 is extendedly in contact with the first N-type doped region 41N of the Zener diode doping structure 41, and is not in contact with the first P-type doped region 41P. In other words, an extension depth of the metal pin 421 contacting the first N-type doped region 41N preferably does not exceed the doping depth of the first N-type doped region 41N.

In addition, another one of the metal pins 421 of the Zener diode metal structure 42 is extendedly in contact with the first P-type doped region 41P of the Zener diode doping structure 41, and is not in contact with the first N-type doped region 41N.

Furthermore, in the Zener diode 4, a potential of the metal pin 421 connected to the first P-type doped region 41P is "lower" than a potential of the metal pin 421 connected to the first N-type doped region 41N, thereby generating a “reverse bias voltage” when the composite power element 100 is energized.

The normal diode metal structure 52 is located in the normal diode formation region B2. The normal diode metal structure 52 is formed on the side surface of the dielectric layer 7 away from the base layer 11, and sequentially passes through the dielectric layer 7 and the cover insulation layer 23 to be in contact with and electrically connected to the normal diode doping structure 51 that is covered by the cover insulation layer 23. The normal diode metal structure 52 and the normal diode doping structure 51 can be matched with each other to form a normal diode 5, $V_D$. The normal diode 5 is configured to receive a forward bias voltage, and the normal diode 5 can withstand a voltage of between 0 volts and 0.7 volts.

In the present embodiment, the normal diode metal structure 52 includes two metal pins 521. The two metal pins 521 of the normal diode metal structure 52 are spaced apart from each other, and both sequentially pass through the dielectric layer 7 and the cover insulation layer 23 to be respectively and electrically connected to the second N-type doped region 51N and the second P-type doped region 51P of the normal diode doping structure 51, so that the normal diode 5 is formed.

More specifically, one of the metal pins 521 of the normal diode metal structure 52 is extendedly in contact with the second N-type doped region 51N of the normal diode doping structure 51, and is not in contact with the second P-type doped region 51P. In other words, an extension depth of the metal pin 421 contacting the second N-type doped region 51N preferably does not exceed the doping depth of the second N-type doped region 51N.

In addition, another one of the metal pins 521 of the normal diode metal structure 52 is extendedly in contact with the second P-type doped region 51P of the normal diode doping structure 51, and is not in contact with the second N-type doped region 51N.

Furthermore, in the normal diode 5, a potential of the metal pin 521 connected to the second P-type doped region 51P is “higher” than a potential of the metal pin 521 connected to the second N-type doped region 51N, thereby generating a “forward bias voltage” when the composite power element 100 is energized.

It is worth mentioning that, in the normal diode 5 of the present embodiment, the metal pin 521 connected to the second P-type doped region 51P can be electrically connected to one of the plurality of gate filling structures 31 (i.e., the rightmost gate filling structure in FIG. 2) through a wire (not shown). Furthermore, the metal pin 521 connected to the second N-type doped region 51N can be electrically connected to the source metal structure 33 of the metal-oxide-semiconductor field-effect transistor 3 through a wire (not shown), but the present disclosure is not limited thereto.

The resistor metal structure 62 is located in the resistor formation region B3. The resistor metal structure 62 is formed on the side surface of the dielectric layer 7 away from the base layer 11, and partially passes through the dielectric layer 7 to be in contact with and electrically connected to the resistor doping structure 61 that is located on the surface of the cover insulation layer 23. The resistor metal structure 62 and the resistor doping structure 61 can be matched with each other to form a resistor 6, R.

In the present embodiment, the resistor metal structure 62 includes two metal pins 621. The two metal pins 621 of the resistor metal structure 62 are spaced apart from each other, and both partially pass through the dielectric layer 7 to be in contact with and electrically connected to the resistor doping structure 61 (i.e., P-type doped semiconductor). The doping concentration of the resistor doping structure 61 is lower than that of the Zener diode doping structure 41 and also lower than that of the normal diode doping structure 51, thereby generating a resistance when the composite power element 100 is energized.

After implementing the above steps S101 to S109, the composite power element 100 (also referred to as a trench-type power element) shown in FIG. 1I and FIG. 2 can be completed.

The equivalent circuit diagram of the composite power element 100 of the present embodiment is shown in FIG. 3. It should be noted that, in practical application, each step may be substituted with a reasonable variation. Furthermore, it should be noted that the above steps are described from the perspective of a cross-sectional view. Under the premise that conditions in the above steps are met, the possibility of implementing the present disclosure with various design layouts is not excluded. In other words, if viewed from a top view, the composite power element 100 of the present disclosure may have different design layouts.

According to the above configuration, the method for manufacturing the composite power element according to the embodiment of the present disclosure can integrate formations of different electronic components (i.e., Zener diode, normal diode, and resistor) into the manufacturing process of the metal-oxide-semiconductor field-effect transistor, so as to form a required power element, where additional processes are not necessary, thereby simplifying a complex process.

In addition, the composite power element according to the embodiment of the present disclosure is a silicon-based architecture in the design of the Zener diode and the normal diode. That is to say, the Zener diode doping structure 41 and the normal diode doping structure 51 are formed in the epitaxial layer 12. Accordingly, the composite power element according to the embodiment of the present disclosure can obtain a relatively stable output voltage, and can be applied to a lower and wider input voltage range.

The method for manufacturing the composite power element according to the embodiment of the present disclosure has been described above. The specific structure of the composite power element of the present embodiment will be described below. It should be noted that although the composite power element of the present embodiment is manufactured by the above-mentioned manufacturing method, the present disclosure is not limited thereto. That is, the composite power element of the present disclosure may be produced by other methods for manufacturing the power element.

Referring to FIG. 11, which is to be read in conjunction with FIG. 2 and FIG. 3, an embodiment of the present disclosure also discloses a composite power element 100, which includes a substrate structure 1, an insulation layer 2, a dielectric layer 7, a metal-oxide-semiconductor field-effect transistor 3 (MOSFET), a Zener diode 4 ($V_Z$), a normal diode 5 ($V_D$), and a resistor 6 (R).

The substrate structure 1 includes a base layer 11 and an epitaxial layer 12 formed on the base layer 11. The epitaxial layer 12 concavely forms at least a trench 13. The substrate structure 1 defines a transistor formation region A and a circuit element formation region B adjacent to the transistor formation region A along a length direction D of the substrate structure 1. The trench 13 is located in the transistor formation region A.

The insulation layer 2 is extendedly formed on the epitaxial layer 12 and an inner wall of the trench 13. The portion of the insulation layer 2 located on the inner wall of the trench 13 is defined as a trench insulation layer 21, and the trench insulation layer 21 surrounds a groove 22. The portion of the insulation layer 2 located on the surface of the epitaxial layer 12 is defined as a cover insulation layer 23. Furthermore, the dielectric layer 7 is formed on the cover insulation layer 23 of the insulation layer 2.

The metal-oxide-semiconductor field-effect transistor 3 is located in the transistor formation region A, and includes a gate filling structure 31, a matrix doping structure 32, a source metal structure 33, and a drain metal structure 34. The gate filling structure 31 is formed in the groove 22 of the trench insulation layer 21. The matrix doping structure 32 is formed in the epitaxial layer 12 and located in a surrounding area of the trench 13, and the matrix doping structure 32 is covered by the cover insulation layer 23. The source metal structure 33 is formed on the dielectric layer 7 and sequentially passes through the dielectric layer 7 and the cover insulation layer 23 to be in contact with and electrically connected to the matrix doping structure 32. The drain metal structure 34 is formed on a bottom surface of the base layer 11.

The Zener diode 4 is located in the circuit element formation region B. The Zener diode 4 includes a Zener diode doping structure 41 and a Zener diode metal structure 42. The Zener diode doping structure 41 is formed in the epitaxial layer 12 and is covered by the cover insulation layer 23. The Zener diode doping structure 41 includes a first P-type doped region 41P and a first N-type doped region 41N.

The first P-type doped region 41P and the first N-type doped region 41N are formed from a top surface 101 toward a bottom surface 102 of the epitaxial layer 12. A doping depth of the first P-type doped region 41P is greater than a doping depth of the first N-type doped region 41N. A doping range of the first P-type doped region 41P is greater than and covers a doping range of the first N-type doped region 41N. The first N-type doped region 41N is formed on an inner side of a top portion of the first P-type doped region 41P. A top surface of the first N-type doped region 41N and a top surface of the first P-type doped region 41P are coplanar, and are flush with the top surface 101 of the epitaxial layer 12. The first N-type doped region 41N is surrounded by the first P-type doped region 41P except for the top surface of the first N-type doped region 41N.

The Zener diode metal structure 42 includes two metal pins 421. The two metal pins 421 of the Zener diode metal structure 42 are spaced apart from each other, and both sequentially pass through the dielectric layer 7 and the cover insulation layer 23 to be respectively and electrically connected to the first N-type doped region 41N and the first P-type doped region 41P of the Zener diode doping structure 41.

More specifically, one of the metal pins 421 of the Zener diode metal structure 42 is extendedly in contact with the first N-type doped region 41N of the Zener diode doping structure 41, and is not in contact with the first P-type doped region 41P. In addition, another one of the metal pins 421 of the Zener diode metal structure 42 is extendedly in contact with the first P-type doped region 41P of the Zener diode doping structure 41, and is not in contact with the first N-type doped region 41N. Furthermore, the Zener diode 4 is configured to receive a reverse bias voltage when the composite power element 100 is energized.

The normal diode 5 is also located in the circuit element formation region B and is spaced apart from the Zener diode 4. The normal diode 5 includes a normal diode doping structure 51 and a normal diode metal structure 52. The normal diode doping structure 51 is formed in the epitaxial layer 12 and is covered by the cover insulation layer 23. The normal diode doping structure 51 includes a second P-type doped region 51P and a second N-type doped region 51N. The normal diode metal structure 52 includes two metal pins 521. The two metal pins 521 of the normal diode metal structure 52 are spaced apart from each other, and both sequentially pass through the dielectric layer 7 and the cover insulation layer 23 to be respectively and electrically connected to the second N-type doped region 51N and the second P-type doped region 51P of the normal diode doping structure 51. The structure of the normal diode 5 is similar to that of the Zener diode 4, and will not be repeated herein. The difference is that the normal diode 5 is configured to receive a forward bias voltage when the composite power device 100 is energized.

The resistor 6 is also located in the circuit element formation region B, and is spaced apart from the Zener diode 4 and the normal diode 5. The resistor 6 includes: a resistor doping structure 61 and a resistor metal structure 62. The resistor doping structure 61 is formed on the cover insulation layer 23 and is covered by the dielectric layer 7. The resistor doping structure 61 is a P-type doped semiconductor or an N-type doped semiconductor. The resistor metal structure 62 is formed on the dielectric layer 7 and sequentially passes through the dielectric layer 7 to be electrically connected to the resistor doping structure 61. Furthermore, the resistor 6 is configured to generate a resistance when the composite power device 100 is energized.

Second Embodiment

Figure 4A:
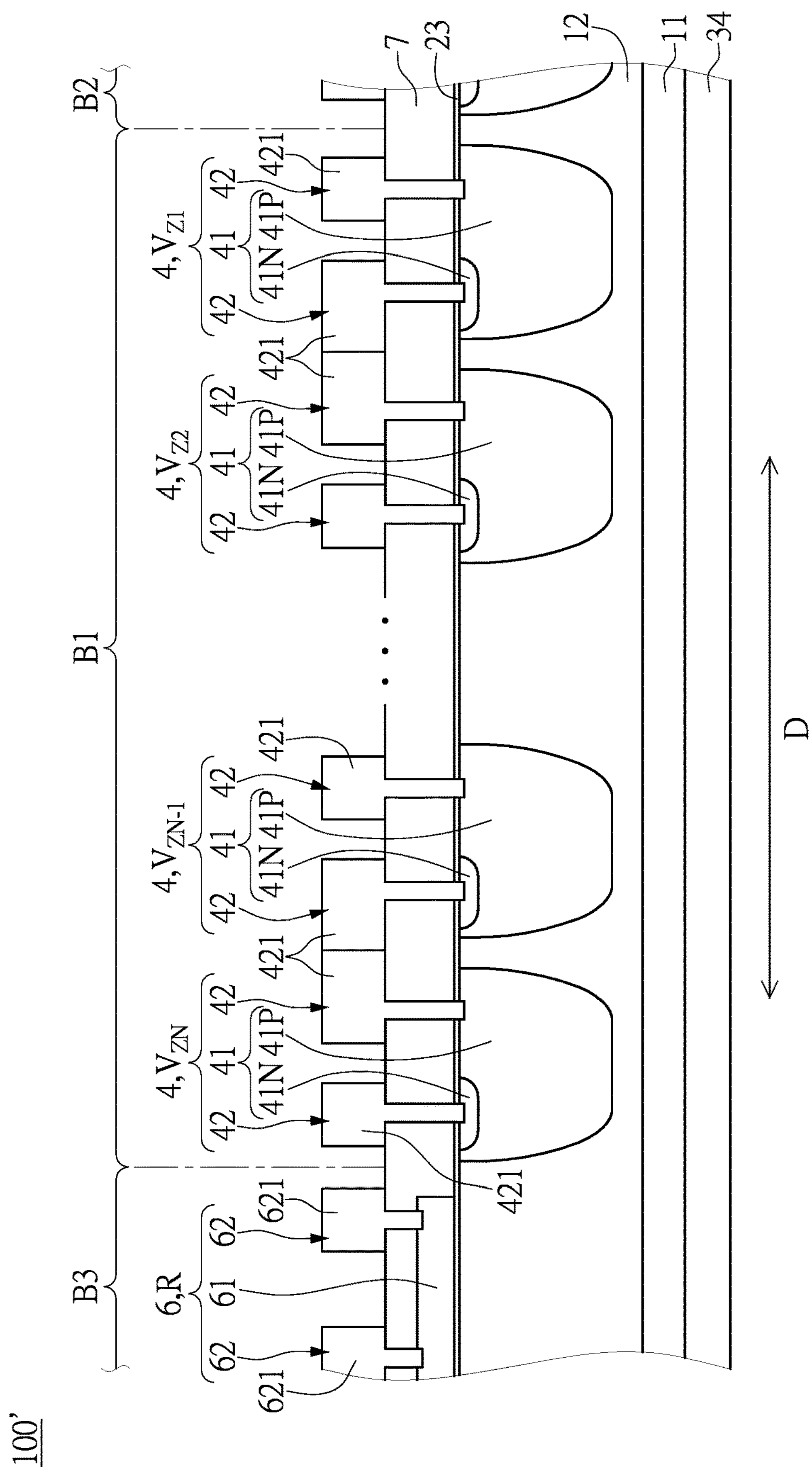
FIG. 4A is a partially enlarged view of a composite power element according to a second embodiment of the present embodiment.
Figure 4B:
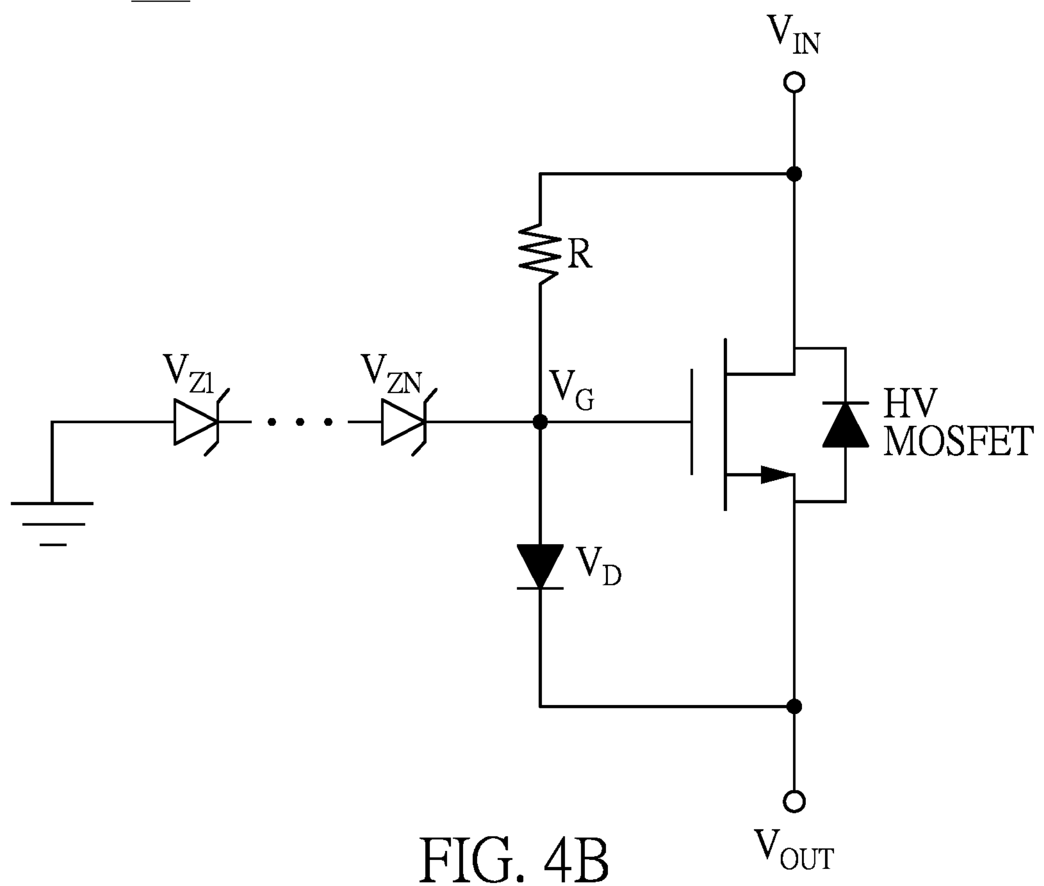
FIG. 4B is an equivalent circuit diagram of the composite power element according to the second embodiment of the present disclosure.

Referring to FIG. 4A and FIG. 4B, a second embodiment of the present disclosure also provides a composite power element 100'. FIG. 4A is a partially enlarged view of the composite power element according to the second embodiment of the present disclosure, and FIG. 4B is an equivalent circuit diagram of the composite power element according to the second embodiment of the present disclosure.

The structural design of the composite power element 100' according to the second embodiment of the present disclosure is substantially the same as the above-mentioned first embodiment. The difference is that the composite power element 100' of the present embodiment has a plurality of Zener diodes 4 ($V_{Z1}$ to $V_{ZN}$) that are connected in series with each other.

In the present embodiment, the quantity of the Zener diodes 4 is plural. The plurality of Zener diodes 4 ($V_{Z1}$ to $V_{ZN}$) are connected in series with each other and are all located in the Zener diode formation region B1 of the circuit element formation region B. The quantity of the plurality of Zener diodes 4 may be, for example, two or more.

More specifically, the plurality of Zener diodes 4 connected in series with each other are arranged in a staggered manner of "N-type doped region/P-type doped region/N-type doped region/P-type doped region, and so on". Further, in any two of the Zener diodes 4 that are adjacent and connected in series with each other, the metal pin 421 of one of the Zener diodes 4 connected to the first P-type doped region 41P is directly in contact with and electrically connected to the metal pin 421 of another one of the Zener diodes 4 connected to the first N-type doped region 41N. In addition, the Zener diode doping structure 41 of the one of the Zener diodes 4 does not directly contact the Zener diode doping structure 41 of the another one of the Zener diodes 4.

As shown in FIG. 4B, since the composite power element 100' of the present embodiment includes the plurality of Zener diodes 4 ($V_{Z1}$ to $V_{ZN}$) connected in series with each other, $V_{GS}$ can be changed by adjusting the quantity of the Zener diodes 4 to control a driving voltage of the composite power element 100' to achieve feasibility of driving various Power MOSFETs.

Third Embodiment

Figure 5A:
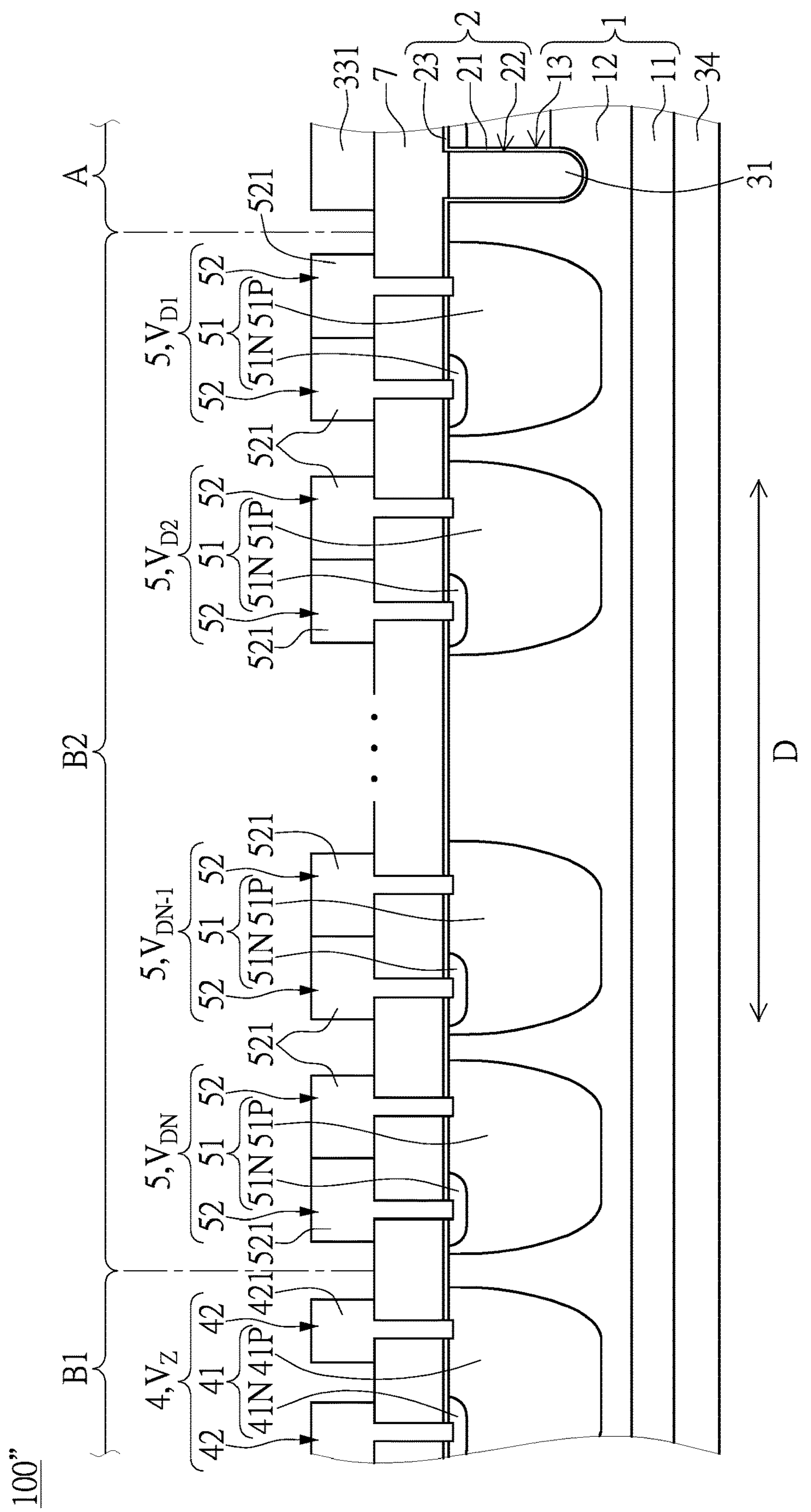
FIG. 5A is a partially enlarged view of a composite power element according to a third embodiment of the present embodiment.
Figure 5B:
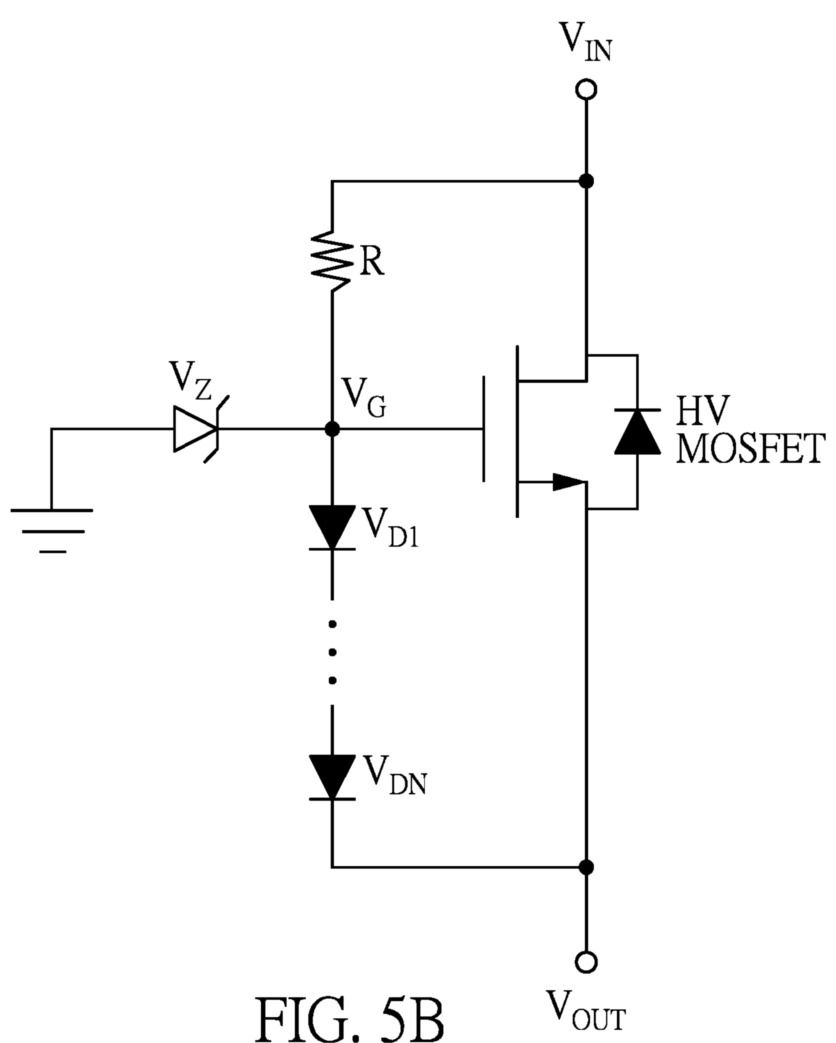
FIG. 5B is an equivalent circuit diagram of the composite power element according to the third embodiment of the present disclosure.

Referring to FIG. 5A and FIG. 5B, a third embodiment of the present disclosure also provides a composite power element 100". FIG. 5A is a partially enlarged view of the composite power element according to the third embodiment of the present disclosure, and FIG. 5B is an equivalent circuit diagram of the composite power element according to the third embodiment of the present disclosure.

The structural design of the composite power element 100" according to the third embodiment of the present disclosure is substantially the same as the above-mentioned first embodiment. The difference is that the composite power element 100" of the present embodiment has a plurality of normal diodes 5 ($V_{D1}$ to $V_{DN}$) that are connected in series with each other.

In the present embodiment, the quantity of the normal diodes 5 is plural. The plurality of normal diodes 5 ($V_{D1}$ to $V_{DN}$) are connected in series with each other and are all located in the normal diode formation region B2 of the circuit element formation region B. The quantity of the plurality of normal diodes 5 may be, for example, two or more.

More specifically, the plurality of normal diodes 5 connected in series with each other are arranged in a staggered manner of "N-type doped region/P-type doped region/N-type doped region/P-type doped region, and so on". Further, in any two of the normal diodes 5 that are adjacent and connected in series with each other, the metal pin 521 of one of the normal diodes 5 connected to the second P-type doped region 51P is directly in contact with and electrically connected to the metal pin 521 of another one of the normal diodes 5 connected to the second N-type doped region 51N. In addition, the normal diode doping structure 51 of the one of the normal diodes 5 does not directly contact the normal diode doping structure 51 of the another one of the normal diodes 5.

As shown in FIG. 5B, since the composite power element 100" of the present embodiment includes the plurality of normal diodes 5 ($V_{D1}$ to $V_{DN}$) connected in series with each other, $V_{GS}$ can be changed by adjusting the quantity of the normal diodes 5 to control a driving voltage of the composite power element 100" to achieve feasibility of driving various Power MOSFETs.

It is worth mentioning that, in an unillustrated embodiment of the present disclosure, the composite power element may also include a plurality of Zener diodes 4 ($V_{Z1}$ to $V_{ZN}$) and a plurality of normal diodes 5 ($V_{D1}$ to $V_{DN}$) connected in series with each other, so that the composite power element have a wider range of applications.

Beneficial Effects of the Embodiments

In conclusion, the composite power element according to the embodiments of the present disclosure can integrate the formations of different electronic components (i.e., Zener diode, normal diode, and resistor) into the structure of the metal-oxide-semiconductor field-effect transistor, so as to form the required power element, where additional processes are not necessary, thereby simplifying the complex process.

In addition, the composite power element according to the embodiments of the present disclosure is a silicon-based architecture in the design of the Zener diode and the normal diode. Accordingly, the composite power element according to the embodiment of the present disclosure can obtain a relatively stable output voltage, and can be applied to a lower and wider input voltage range.

Furthermore, since the composite power element according to the embodiments of the present disclosure can be designed to include the plurality of Zener diodes 4 ($V_{Z1}$ to $V_{ZN}$) connected in series with each other and/or the plurality of normal diodes ($V_{D1}$ to $V_{DN}$) connected in series with each other, the $V_{GS}$ can be changed by adjusting the quantity of the Zener diodes and the normal diodes to control the driving voltage of the composite power element to achieve the feasibility of driving various Power MOSFETs.

In addition, the structural design of the composite power element according to the embodiments of the present disclosure can reduce the quantity of electronic components required to be placed on a system circuit board. Since a part of the electronic components are integrated into an integrated component manufacturing process, the volume of the end product can therefore be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A composite power element, comprising:

a substrate structure including a base layer and an epitaxial layer formed on the base layer; wherein at least one trench is concavely formed on the epitaxial layer, the substrate structure defines a transistor formation region and a circuit element formation region that is adjacent to the transistor formation region along a length direction of the substrate structure, and the trench is located in the transistor formation region;

an insulation layer being extendingly formed on the epitaxial layer and an inner wall of the trench; wherein a portion of the insulation layer located on the inner wall of the trench is defined as a trench insulation layer, the trench insulation layer surroundingly forms a groove, and a portion of the insulation layer located on a surface of the epitaxial layer is defined as a cover insulation layer;

a dielectric layer being formed on the cover insulation layer;

a metal-oxide-semiconductor field-effect transistor being located in the transistor formation region and including:

a gate filling structure being formed in the groove of the trench insulation layer;

a matrix doping structure being formed in the epitaxial layer and located in a surrounding area of the trench, and the matrix doping structure being covered by the cover insulation layer;

a source metal structure being formed on the dielectric layer and sequentially passing through the dielectric layer and the cover insulation layer to be in contact with the matrix doping structure; and a drain metal structure being formed on a bottom surface of the base layer; and a Zener diode being located in the circuit element formation region and including:

a Zener diode doping structure being formed in the epitaxial layer and being covered by the cover insulation layer; wherein the Zener diode doping structure includes a first P-type doped region and a first N-type doped region; and a Zener diode metal structure being formed on the dielectric layer and sequentially passing through the dielectric layer and the cover insulation layer to be in contact with the first P-type doped region and the first N-type doped region of the Zener diode doping structure, so that the Zener diode is capable of receiving a reverse bias voltage when the composite power element is energized.

2. The composite power element according to claim 1, wherein, in the Zener diode, the first P-type doped region and the first N-type doped region are both formed by doping down from a top surface of the epitaxial layer, a doping depth of the first P-type doped region is greater than a doping depth of the first N-type doped region, and a doping range of the first P-type doped region is greater than and covers a doping range of the first N-type doped region.

3. The composite power element according to claim 2, wherein the first N-type doped region is formed on an inner side of the first P-type doped region, a top surface of the first N-type doped region and a top surface of the first P-type doped region are coplanar and flush with the top surface of the epitaxial layer, and the first N-type doped region is surrounded by the first P-type doped region except for the top surface of the first N-type doped region.

4. The composite power element according to claim 2, wherein the Zener diode metal structure includes two metal pins, the two metal pins are spaced apart from each other and both sequentially pass through the dielectric layer and the cover insulation layer to be respectively and electrically connected to the first N-type doped region and the first P-type doped region of the Zener diode doping structure.

5. The composite power element according to claim 4, wherein one of the metal pins of the Zener diode metal structure extends to be in contact with the first N-type doped region of the Zener diode doping structure, and is not in contact with the first P-type doped region, and another one of the metal pins of the Zener diode metal structure is extendedly in contact with the first P-type doped region of the Zener diode doping structure, and is not in contact with the first N-type doped region; wherein a potential of the metal pin that is connected to the first P-type doped region is lower than a potential of the metal pin that is connected to the first N-type doped region, so as to generate the reverse bias voltage when the composite power element is energized.

6. The composite power element according to claim 1, further comprising: a normal diode; wherein the normal diode is also located in the circuit element formation region and is spaced apart from the Zener diode, the normal diode includes a normal diode doping structure and a normal diode metal structure; wherein the normal diode doping structure is formed in the epitaxial layer and is covered by the cover insulation layer, the normal diode doping structure includes a second P-type doped region and a second N-type doped region; wherein the normal diode metal structure includes two metal pins, the two metal pins of the normal diode metal structure are spaced apart from each other and both sequentially pass through the dielectric layer and the cover insulation layer to be respectively and electrically connected to the second N-type doped region and the second P-type doped region of the normal diode doping structure, so that the normal diode is capable of receiving a forward bias voltage when the composite power device is energized.

7. The composite power element according to claim 6, further comprising: a resistor; wherein the resistor is also located in the circuit element formation region and is spaced apart from the Zener diode and the normal diode;

wherein the resistor includes: a resistor doping structure and a resistor metal structure, the resistor doping structure is formed on the cover insulation layer and is covered by the dielectric layer, the resistor doping structure is a P-type doped semiconductor or an N-type doped semiconductor, the resistor metal structure is formed on the dielectric layer and partially passes through the dielectric layer to be electrically connected to the resistor doping structure; wherein the resistor is configured to generate a resistance when the composite power device is energized.

8. The composite power element according to claim 1, wherein, in the metal-oxide-semiconductor field-effect transistor, the matrix doping structure includes a matrix P-type doped region and two matrix N-type doped regions formed on the matrix P-type doped region; the two matrix N-type doped regions and the matrix P-type doped region are stacked on top of each other; the matrix P-type doped region is located on a lower portion of the matrix doping structure and abuts against the epitaxial layer; the two matrix N-type doped regions are located on an upper portion of the matrix doping structure, the two matrix N-type doped regions are located on two sides of a top portion of the matrix P-type doped region and are spaced apart from each other, and the two matrix N-type doped regions are covered by the cover insulation layer.

9. The composite power element according to claim 8, wherein the source metal structure includes a source metal conductive portion and at least one source metal contact plug connected to the source metal conductive portion, the source metal conductive portion is formed on the dielectric layer, and the source metal contact plug sequentially passes through the dielectric layer and the cover insulation layer to be electrically connected to the matrix doping structure; wherein the source metal contact plug extends into an area between the two matrix N-type doped regions, and the source metal contact plug is in contact with the two matrix N-type doped regions and in contact with the matrix P-type doped region.

10. The composite power element according to claim 8, wherein formations of the two matrix N-type doped regions of the matrix doping structure and the first N-type doped region of the Zener diode doping structure are all completed in a same ion implantation process.

* * * * *